United States Patent [19]

Dix et al.

[11] Patent Number: 5,295,113
[45] Date of Patent: Mar. 15, 1994

[54] FLASH MEMORY SOURCE INHIBIT GENERATOR

[75] Inventors: Patricia L. Dix, San Jose; Steven E. Wells, Citrus Height, both of Calif.

[73] Assignee: Intel Corporation, Santa Clara, Calif.

[21] Appl. No.: 697,716

[22] Filed: May 9, 1991

[51] Int. Cl.⁵ .............................. G11C 11/40
[52] U.S. Cl. .................... 365/228; 365/229
[58] Field of Search ............... 365/189.01, 189.08, 365/218, 228, 229, 226, 900

[56] References Cited

U.S. PATENT DOCUMENTS

| | | | |
|---|---|---|---|
| 3,500,142 | 3/1970 | Kahng | 307/211 |
| 3,660,819 | 5/1972 | Frohman-Bentchkowsky | 305/185 |
| 3,755,721 | 8/1973 | Frohman-Bentchkowsky | 257/315 |
| 4,099,196 | 7/1978 | Simko | 257/317 |
| 4,203,158 | 5/1980 | Frohman-Bentchkowsky et al. | 365/185 |
| 4,875,188 | 10/1989 | Jungroth | 365/185 |
| 4,964,084 | 10/1990 | Jung et al. | 365/228 X |
| 5,142,495 | 8/1992 | Canepa | 365/189.09 |

Primary Examiner—Steven Mottola
Attorney, Agent, or Firm—Blakely, Sokoloff, Taylor & Zatman

[57] ABSTRACT

Circuitry for preventing slow erasing and slow programming in non-volatile semiconductor memories is disclosed. This circuitry establishes the potential on the source regions of cells in blocks not currently being programming so as to substantially prevent the occurrences of slow erasing and slow programming which can alter the state or condition of the cells.

22 Claims, 4 Drawing Sheets

FLASH MEMORY SOURCE INHIBIT GENERATOR

FIELD OF THE INVENTION

The present invention relates to the field of non-volatile semiconductor memories. More specifically, the present invention relates to the field of electrically programmable read-only memories, particularly those susceptible to slow-erasing and slow programming.

BACKGROUND OF THE INVENTION

Metal-Oxide-Semiconductor (MOS) electrically programmable read-only memories (EPROMS) frequently use memory cells that have electrically isolated gates (floating gates). These floating gates are typically completely surrounded by insulation and formed from a polycrystalline silicon (polysilicon) layer. Information is stored in the memory cells or devices in the form of charge on the floating gates. Charge is transported to the floating gates by a variety of mechanisms such as avalanche injection, channel injection, tunnelling, etc., depending upon the construction of the cells. The cells are erased generally by exposing the array to ultraviolet radiation. An example of these cells can be found in U.S. Pat. Nos. 3,500,142; 3,660,819; 3,755,721; and 4,099,196. In some cases these cells are electrically erasable (EEPROM) cells. An example of such a cell is shown in U.S. Pat. No. 4,203,158.

The invention of the present application is used with an EPROM cell, particularly one which is electrically erasable, commonly referred to as a "flash" EPROM cell.

Due to the nature and design of a typical flash memory device, the entire device must be erased in order to erase any one cell in that device. Flash memory array blocking allows segregating different portions or types of data. In this way, when one portion needs to be erased, the other portion(s) do not have to be erased.

However, whenever any cells in a given block are programmed, even cells in another block may be affected by such effects as slow programming due to the combination of potentials necessarily applied to the cells.

Prior attempts at controlling these combination of potentials have met with limited success and have revealed such effects as slow erasing, again due to the combination of potentials then applied to the cells.

Proper control of all of the potentials applied to all of the cells in all of the blocks of a flash memory array, as discussed herein, substantially eliminates the problems of both slow programming and slow erasing.

SUMMARY AND OBJECTS OF THE INVENTION

One object of the present invention is to provide a voltage generation means to the source regions of cells in a non-volatile semiconductor memory.

Another object of the present invention is to provide a switchable voltage generation means to the source regions of cells in a non-volatile semiconductor memory.

These and other objects are provided for in an electrically erasable and electrically programmable read-only memory fabricated on a silicon substrate and employing a plurality of memory cells arranged in blocks each memory cell having a floating gate wherein an improvement for maintaining the state of the cells in blocks not presently being programmed is comprised of first and second bias potentials, the first bias potential being lower than a programming potential and the second bias potential being lower than the first potential, first, second and third transistors coupled in series between the programming potential and ground, the first and third transistors being matched one to another, the gate of the first transistor being coupled to the first bias potential, the gate of the third transistor being coupled to the second bias potential and the gate of the second transistor being coupled to a first node disposed between the first and second transistors, the first and third transistors providing a first potential at the first node disposed between the first and said second transistor. The improvement further comprises fourth and fifth matched transistors coupled in series between a reading potential and ground, the gate of the fourth transistor coupled to the first node and the gate of the fifth transistor coupled to the gate of the third transistor such that the gate of the fourth transistor is approximately at the first potential and the gate of the fifth transistor is at the second bias potential, the fourth and fifth transistors providing a second potential at a second node disposed between the fourth and fifth transistors. The improvement further comprises switch means for switching the source of the cells in blocks not presently being programmed to the second potential if cells in other blocks are presently being programmed.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A flash EPROM memory array is described which substantially prevents slow erasing and slow programming from occurring. In the following description, numerous specific details are set forth such as specific number of bit lines in a block in order to provide a thorough understanding of the present invention. It will, however, be obvious to one skilled in the art that the present invention may be practiced without these specific details. In other instances, well-known processes and well-known circuits have not been described in detail in order not to unnecessarily obscure the present invention.

Figure 1:
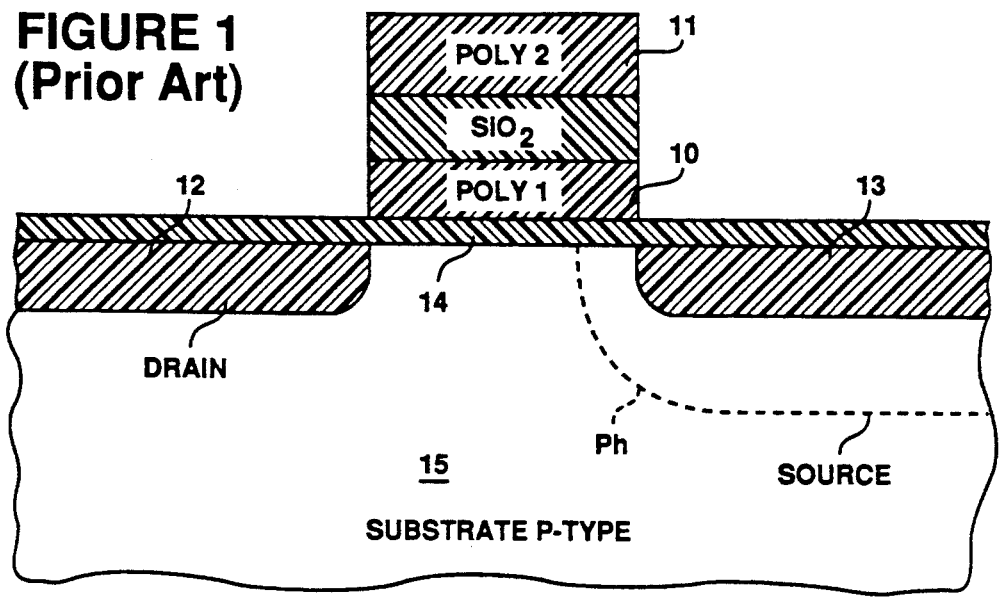
FIG. 1 is cross-section elevational view of a prior art non-volatile floating gate memory device or cell used in the currently preferred embodiment of the present invention.

Referring now to FIG. 1, the memory device or cell used with the presently preferred embodiment is formed on a silicon substrate such as the p-type substrate of FIG. 1. (The device of FIG. 1 is shown in a partially fabricated state since this best reveals its structure.) The device includes a pair of spaced-apart doped regions disposed in the substrate specifically a drain region 12 and a source region 13. A polysilicon floating gate 10 is generally disposed above and between these regions and insulated from these regions by a layer of silicon dioxide or other insulative layer 14. The floating gate 10 at the completion of the processing is completely surrounded by insulative layers and hence, electrically floats. A second gate (control gate 11) is disposed above the floating gate 10; in the presently preferred embodiment this gate is fabricated from a second layer of polysilicon. This control gate is a continuous polysilicon strip forming a word line of the memory of FIG. 3.

The memory device of the presently preferred embodiment uses asymmetrically doped source and drain regions. The source and drain regions are both doped with an arsenic dopant and the source region is additionally doped with a phosphorous dopant. Hence, the source region is more deeply doped and additionally the source region overlaps the overlying floating gate.

It will be appreciated that the cell of FIG. 1 may be fabricated using well known NMOS technology or CMOS technology. The n-channel device illustrated in FIG. 1 may be fabricated directly in a p-type substrate or when an n-type substrate is used may be fabricated in a p-type well formed in the substrate. Other well-known variations such as employing both p-wells and n-wells are well known in the art.

As currently employed, the memory devices are programmed (i.e., negatively charging the floating gate) by coupling the word line or control gate 11 to a potential of approximately +12 volts, the drain region to a potential of approximately +7 volts, and the source region to ground. With these conditions, channel hot electron injection occurs through the oxide layer 14 which layer is approximately 115 Å thick in the currently preferred embodiment. To erase the cell, the drain region is floated, the word line or control gate 11 is grounded and a potential of approximately +12 volts is applied to the source region. Under these conditions, charge is tunnelled from the floating gate. During reading of the cell, a positive potential less than that which would cause charge to transfer onto the floating gate is applied to the control gate (e.g., 5 volts) and a potential (e.g., 1 volt) is applied to the drain region. Current through the device is sensed to determine if the floating gate is or is not negatively charged. As with other floating gate devices, the negative charge on the floating gate shifts the threshold voltage of the device making it less conductive. Thus, with a sense amplifier the presence or absence of charge on the floating gate can be determined. This defines if a cell is programmed with a binary one or zero.

Figure 3:
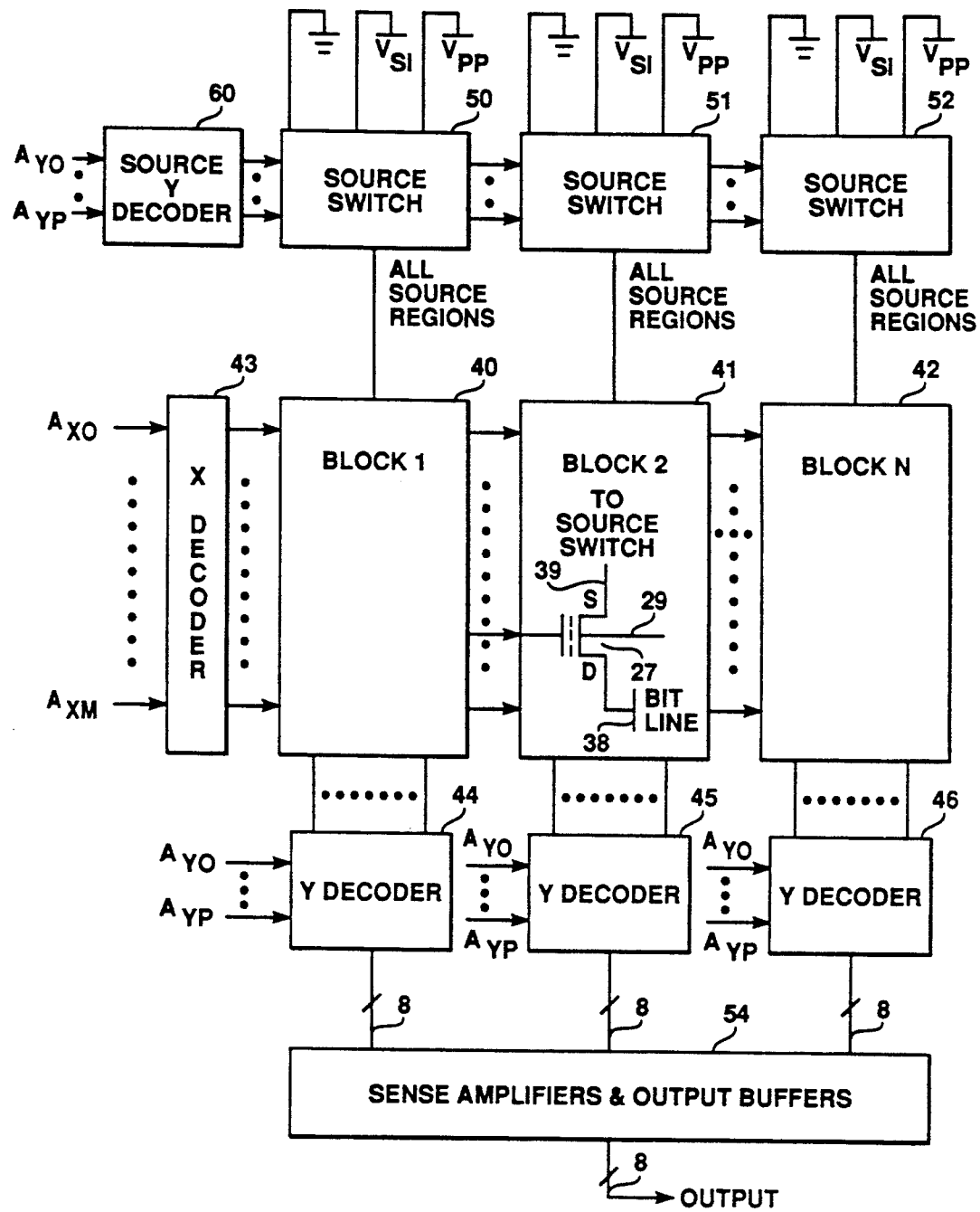
FIG. 3 is a block diagram of a layout of a prior art memory device.

Referring now to FIG. 3, the memory cells in the currently preferred embodiment are formed at intersections of word lines and bit lines as is the common practice. The drain terminals of the memory cells are coupled to the bit line. The control gates are formed from continuous strips of polysilicon which extend across the entire array. The generally parallel bit lines are perpendicular to the generally parallel word lines. For example, cell 27 has its drain region coupled to bit line 38, and its source region 39 coupled to source switch 51. The word line 29 extends to a plurality of other cells along the word line.

In accordance with the present invention, the cells are organized into logical blocks. Each block comprises a plurality of bit lines, for example, each of the blocks 40, 41, and 42 of FIG. 3 in the currently preferred embodiment contain 896 (main block), 64 (boot block), and 64 (parameter block) bit lines, respectfully. Parameter block 42 may be further divided into two logical blocks of 32 bit lines each. The source regions for all the cells in each of the blocks are connected to a common node allowing this node to be switched to one of three potentials by a source switch. There is a source switch associated with each of the blocks, for instance, block 40 is coupled to source switch 50, block 41 to source switch 51 and block 42 to source switch 52.

The X decoder 43 selects a single word line in the memory, from the 1024 possible word lines in the currently preferred embodiment of the present invention, for each of the addresses applied to it. The Y decoders 44, 45 and 46 for each of the Y addresses select one byte (8 bit lines) from one of the blocks and couples 8 bit lines from the selected block to the sense amplifier and output buffers 54. (Only one logical block is a selected block for any given Y address.) The source switches are controlled by the source Y decoder 60 which in the currently preferred embodiment is part of the Y decoders 44, 45 and 46, and, as will be described, decoder 60 causes the source regions of the cells in the selected and unselected blocks to be coupled to one of three potentials for reading, programming and erasing.

Figure 2A:
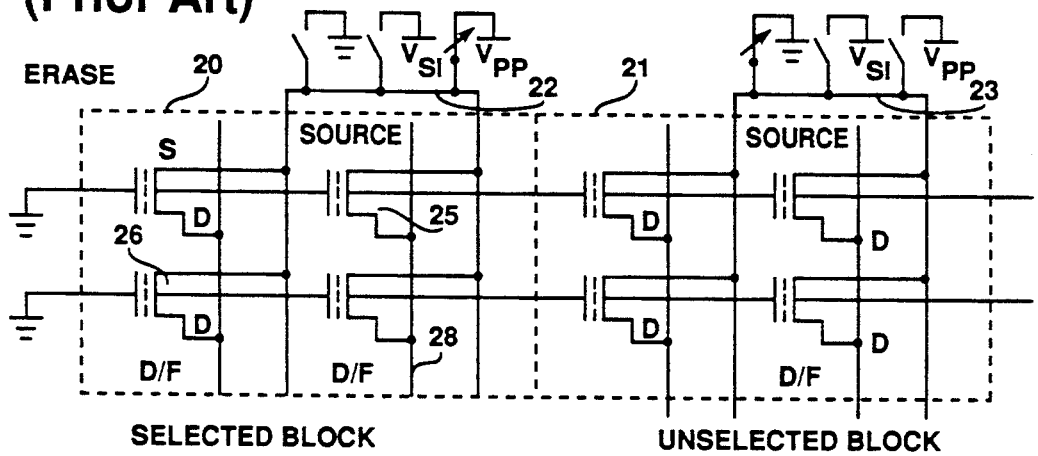
FIG. 2a illustrates the potentials applied to the source regions for a selected block and an unselected block during erasing.

Referring now to FIG. 2a, the voltages employed during erasing for a selected block and unselected block are illustrated. (A block is selected when cells in that block are selected for programming or reading. Entire blocks are selected for erasing, one at a time.) Block 20 represents a selected block and includes a plurality of memory cells within the block such as cell 25. Block 21 represents an unselected block, again illustrating a plurality of cells disposed within the block. All the source regions of all the cells within block 20 are coupled to a common node or line 22. Similarly, all the source regions for the cells in block 21 are coupled to a common line or node 23.

During erasing, if block 20 is selected, the source regions of the cells are connected to the programming potential ($V_{PP}$) through the source switches shown in FIG. 3. This programming potential in the currently preferred embodiment is +12 volts. The source switches for the unselected blocks are coupled to ground through the source switches, thus line 23 is shown coupled to ground. For erasing, all the control gates are coupled to ground potential. All the drain regions are left floating, thus, for example, line 28 of block 20 and the other bit lines in the selected and unselected blocks are left floating. For these conditions, any negative charge on the floating gates of the cells in the selected block is removed through the source region thus erasing the floating gates (leaving them neutrally charged). Under these conditions, all of the cells in a single block are erased and the memory cells in the unselected blocks remain unchanged.

Figure 2B:
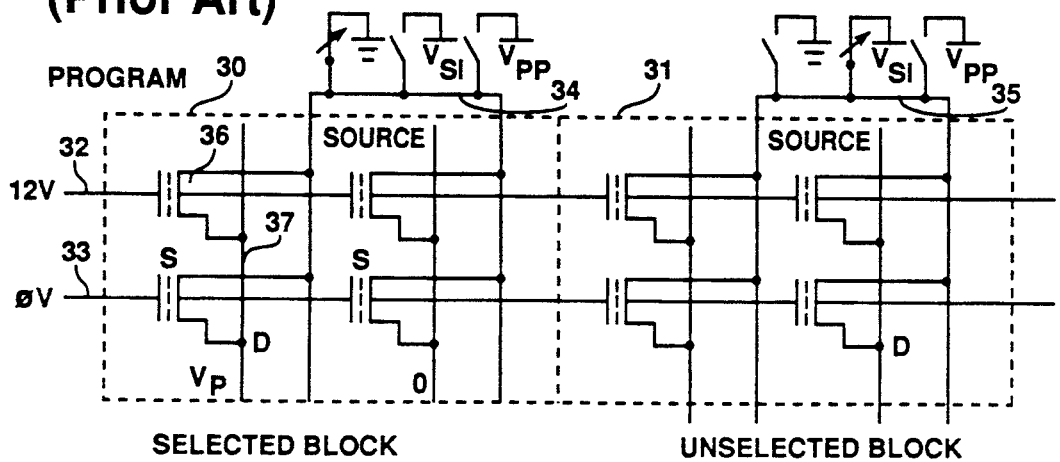
FIG. 2B illustrates the potentials applied to the source regions for a selected block and an unselected block during programming.

FIG. 2B illustrates the potentials applied during programming of cells. Again, two blocks are shown, a selected block 30 and an unselected block 31. Each of the blocks contain a plurality of cells with all the source regions of the cells in block 30 being coupled to line 34 and all the source regions of all the cells in block 31 being coupled to line 35. During programming, all the source regions in the selected block are coupled to ground through the source switch and all the source regions in the unselected block are coupled to a potential which shall be discussed, $V_{SI}$ (source inhibit potential). In the currently preferred embodiment, $V_{SI}$ is approximately +2 volts.

Assume that the X decoder has selected line 32 for programming and that the cells along this word line in block 30 are to be programmed. If, for example, cell 36 is to be programmed (that is, its floating gate is to be negatively charged), the drain region of memory cell 36 is coupled to a potential Vp (e.g., +7 volts), while the selected word line 32 is held at 12 volts. Under these conditions charge is transferred from the substrate to the floating gate. Since the word line 33 and the other word lines are held at zero potential, none of the other cells along the bit line 37 are programmed. The unselected bit lines both in block 30 and the unselected blocks are held at zero potential, hence, no programming occurs in the other memory cells, both along the selected word line and unselected word lines.

The programming operation is typically a slow operation and it is possible that the +12 volts applied to the selected word line can cause slow programming in cells along this word line in unselected blocks even though the drain regions of cells in these blocks are connected to ground. This can be prevented by raising the potential on the source regions of those cells to, for example, +5 volts (the nominal potential used by the memory). This is discussed in U.S. Pat. No. 4,698,787. However, it has been found that by doing this slow erasing occurs in cells along unselected word lines since these cells have their control gates at zero potential, drain regions at zero potential and source regions at +5 volts. Rather, it has been found to be more effective to hold the source regions at a potential lower than, for example, +5 volts; this potential is shown as the potential $V_{SI}$ in FIG. 2B. In the currently preferred embodiment, this potential is approximately +2 volts. This potential is low enough to prevent erasing along unselected word lines yet high enough to prevent programming along selected word lines.

In FIG. 3, only three blocks are shown. In practice, many more blocks may be used. Each block contains a plurality of bit lines. The specific number of blocks, the specific number of bit lines per block and the specific number of word lines are not critical to the present invention. However, as will be explained, the number of cells per block can affect the $V_{SI}$ rise time for a given block, and as such, the switching circuitry is sized in the currently preferred embodiment of the present invention in order to provide more consistent rise times across all the blocks.

The Y decoders 44, 45 and 46 may be ordinary decoders which select 8 bit lines (or any other number) from one of the blocks for coupling to the sense amplifiers. A subset of the Y addresses is required by the source Y decoder 60 to provide a signal to indicate which block has been selected and conversely which blocks are not selected. Thus, the signals for the source switches 50, 51, and 52 may come from an intermediate decoding stage and the Y decoder used for selecting the bytes from the blocks, or a separate source decoder 60 may be used. As shown, each of the source switches 50, 51 and 52 couples its respective block to either ground, the disturb inhibit potential or the programming potential $V_{PP}$. These switches are described in more detail below.

Assume that the entire memory of FIG. 3 is to be programmed with a new program. Before this can occur, all the blocks are erased. As mentioned in connection with FIG. 2a, the source switches of each of the blocks couple its respective block (sequentially to minimize current flow) to the $V_{PP}$ potential. The source switches for the unselected blocks maintain the unselected blocks at zero. The Y decoders during this erase operation allow the drains to float. The X decoder couples the word lines to ground potential. In this manner, all of the cells and all of the blocks are erased. (After initial programming, it is expected that one or more blocks will be selected for reprogramming. In this case only the blocks requiring reprogramming are erased.)

Once erasing has occurred, the cells may be programmed. For example, all the cells in block 41 may be programmed—one byte at a time. For programming under these circumstances, the source switches 50 and 52 couple the source regions for blocks 40 and 42 to the source inhibit potential $V_{SI}$. The source switch 51 couples the source regions of the cells in block 41 to ground. The X decoder 43 sequentially selects one word line at a time for programming by coupling that line to +12 volts. Those cells which are to be programmed then have their drain regions coupled to the $V_P$ potential. All the other drain terminals, both in the selected and unselected blocks remain at ground potential. This is done by the Y decoders. The input data determines which of the drain regions are coupled to $V_P$ for programming.

During the reading of data, a word line is selected by the X decoder and for the illustrated embodiment, one byte is selected from one of the blocks. For reading, all the source switches, both for the selected and unselected blocks, couple the source regions to ground. The drain regions (bit lines) of the selected cells in the selected blocks are coupled to a potential of approximately +1 volt. The selected word line is maintained at a reading potential, $V_{CC}$, of approximately 5 volts. Whether or not a cell is programmed can then be determined by the conductivity of the cell using ordinary sense amplifiers.

Figure 4:
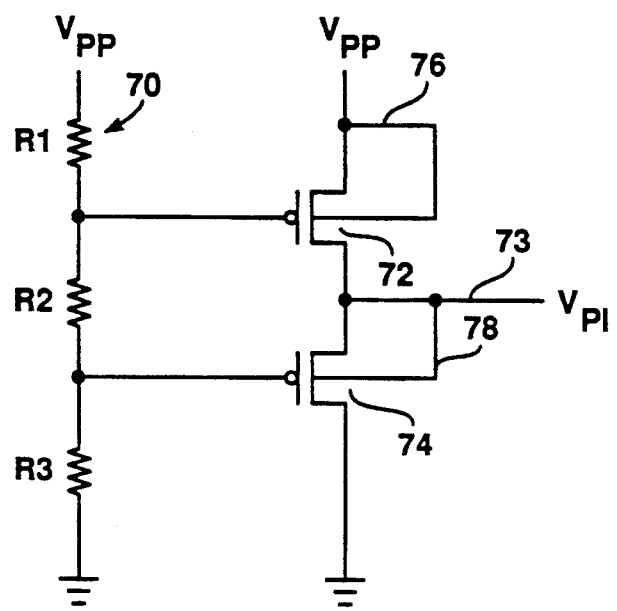
FIG. 4 is an electrical schematic showing a prior art voltage margining circuit used in the present invention.

The circuit of FIG. 4 is coupled to the $V_{PP}$ potential and used to generate an internal margin voltage. In FIG. 4 a resistor 70 is shown which is formed in the substrate. In the currently preferred embodiment, this resistor comprises a p-type diffusion in an n-well region fabricated in the p-type substrate. This resistor is coupled between the $V_{PP}$ potential and ground.

A pair of p-type matched field-effect transistors 72 and 74 are coupled in series between the $V_{PP}$ potential and ground. These transistors are matched in that they both have the same channel width and length and are fabricated close to one another on the substrate so that they are both subjected to the same processing. Since the process variations between these two transistors will be very slight, they both have the same threshold voltage (except for body effect discussed later). In the currently preferred embodiment, the transistors 72 and 74 are fabricated in different n-type wells for reasons which are explained below.

The internal margin (regulated) potential $V_{PI}$ is generated at the node between transistors 72 and 74 on line 73. The gates of transistors 72 and 74 are coupled to the resistor 70 and as illustrated a resistance R1 is present between the gate of transistor 72 and the $V_{PP}$ potential, a resistance R2 between the gates of the transistors 72 and 74, and a resistance R3 between the gate of transistor 74 and ground (although R3 can be eliminated, as is done in the currently preferred embodiment of the present invention, in which case the potential on the gate of transistor 74 is ground).

Assume that the capacitance associated with line 73 has been charged then the same current flows through the transistors 72 and 74. If the transistors are in saturation and their threshold voltages are equal, their gate source voltages cancel each other. The potential $V_{PI}$ equals the voltage across R1 and R3: $V_{PI}=V_{PP}(R1+R3/R1+R2+R3)$. The resistances R1, R2 and R3 can be accurately determined (and, as stated above, R3 may be eliminated entirely). The externally generated $V_{PP}$ can be carefully regulated. Since the thresholds of transistors 72 and 74 are cancelled, the internally generated potential $V_{PI}$ remains constant from chip-to-chip. That is, the matched transistors provide compensation for process variation as well as temperature variation.

The threshold voltages of transistors 72 and 74 will not be equal even if the transistors are matched, if they are both fabricated directly in the substrate or in a common well. The reason for this is that the source of transistor 72 is at a higher potential than the source of transistor 74; the body effect associated with these different potentials will cause the transistors to have different threshold voltages. To solve this problem, each of the transistors is fabricated in separate n-wells and the wells are connected so as to cancel this body effect. The wells are connected to the source terminals of their respective transistor. Specifically, the n-well associated with transistor 72 is connected to the $V_{PP}$ potential as indicated by line 76 and the n-well associated with the transistor 74 is connected to the line 73 as indicated by line 78.

Figure 5:
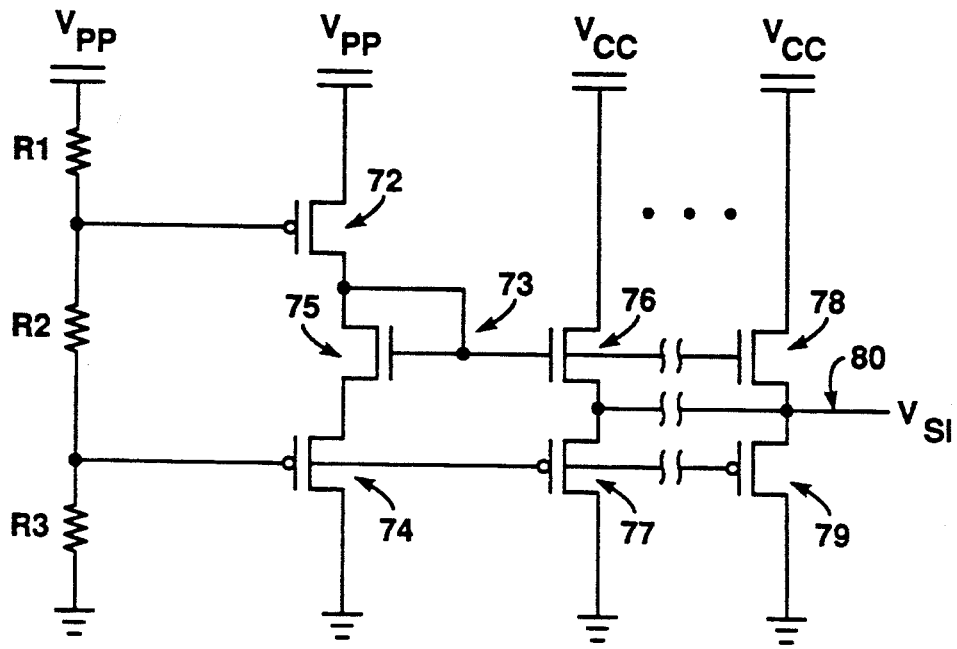
FIG. 5 is an electrical schematic showing the voltage generating circuit of the present invention.

Referring now to FIG. 5, additional circuitry can be seen combined with and added to the circuitry of FIG. 4. An n-type field-effect transistor 75 is located in series between matched p-type transistors 72 and 74. The drain and the gate of transistor 75 are both connected to the drain of transistor 72 to thus comprise the node 73.

The gate of another n-type field-effect transistor 76, which transistor is matched to transistor 75, is also coupled to node 73. Similarly, the gate of another p-type field-effect transistor 77 is coupled to the gate of transistor 74. Transistor 77 is a matched transistor to transistor 74. Transistors 76 and 77 are themselves coupled in series between the VCC potential and ground.

With matched transistors 75 and 76 having their gates coupled to the same potential at node 73, and with the current through them being equal, their gate-to-source voltage drops will be equal. Furthermore, if the source-to-gate voltage drops of matched transistors 74 and 77 are equal and the current through them is equal, because their gates are coupled together the drain-to-source voltage drops across them is also equal. In this way, transistors 76 and 77 mirror transistors 75 and 74.

Signal line 80, coupled to a node located between transistors 76 and 77, outputs the $V_{SI}$ voltage signal of approximately +2 volts. Furthermore, please note that the $V_{SI}$ output voltage is charged through the $V_{CC}$ supply, not the $V_{PP}$ supply. This is important because for a given current level, driving with a lower potential lowers the total power expended. In other words, with a current of 30 mA, using the +5 volt $V_{CC}$ supply only consumes 150 mW while using the +12 volt $V_{PP}$ supply consumes 360 mW, or 150% more power to drive the same current.

Additionally, because node 73 is driven by the $V_{PP}$ supply, the output voltage is still regulated by the larger +12 volt $V_{PP}$ supply. This is important because one of the objectives of this circuitry is not necessarily to set $V_{SI}$ to an absolute +2 volts, but, rather, to maintain a relative voltage differential between the $V_{PP}$ potential and the $V_{SI}$ potential. This is significant because it is this voltage differential which needs to be low enough to prevent erasing along unselected word lines yet high enough to prevent programming along selected word lines. Test data has shown $V_{SI}$ varying from a low of approximately +1.9 volts with $V_{PP}$ at approximately +11 volts to a high of approximately +2.2 volts with $V_{PP}$ at approximately +13 volts, thus showing $V_{SI}$ tracking the variation in $V_{PP}$. Also significant, test data has shown negligible variation in $V_{SI}$ with variations in $V_{CC}$ (for instance, test data has shown $V_{SI}$ varying by no more than 0.05 V while $V_{CC}$ varied by as much as 0.6 V) thus indicating that, although $V_{SI}$ is driven by $V_{CC}$, $V_{SI}$ is not overly affected by fluctuations in $V_{CC}$.

Again, due to the voltage drops across transistors 76 and 77, the $V_{SI}$ signal is approximately +2 volts. However, the $V_{SI}$ current is limited by the ability of transistors 76 and 77 to drive output signal line 80. Strengthening the $V_{SI}$ current drive is achieved by coupling additional sets of mirror transistor pairs in parallel as is shown by transistors 78 and 79 of FIG. 5.

The gate of n-type field-effect transistor 78 is coupled to the gate of transistor 76 and is matched to it. The gate of p-type field-effect transistor 79 is coupled to the gate of transistor 77 and is matched to it. And as with transistors 76 and 77, transistors 78 and 79 are coupled in series between the $V_{CC}$ potential and ground with a node between transistors 78 and 79 coupled to the output signal line 80. In this way, the current drive of signal line 80 is boosted by the multiple sets of mirror transistor pairs 76 and 77, 78 and 79, etc. The number of mirror transistor pairs is based upon the size of the capacitive load to be driven and the available chip real estate in which to form the transistors. In the preferred embodiment of the present invention, there are 14 pairs of mirror transistor pairs coupled in parallel as shown in FIG. 5.

Furthermore, it is advantageous to route signal line 80 to the appropriate points on a given circuit chip rather than routing a signal line directly from node 73 to various mirror transistor pairs at these same points. This is because of the greater power generated on signal line 80 by the multiple mirror transistor pairs which can thus more easily overcome the various noise elements which exist on a typical circuit chip.

Figure 6:
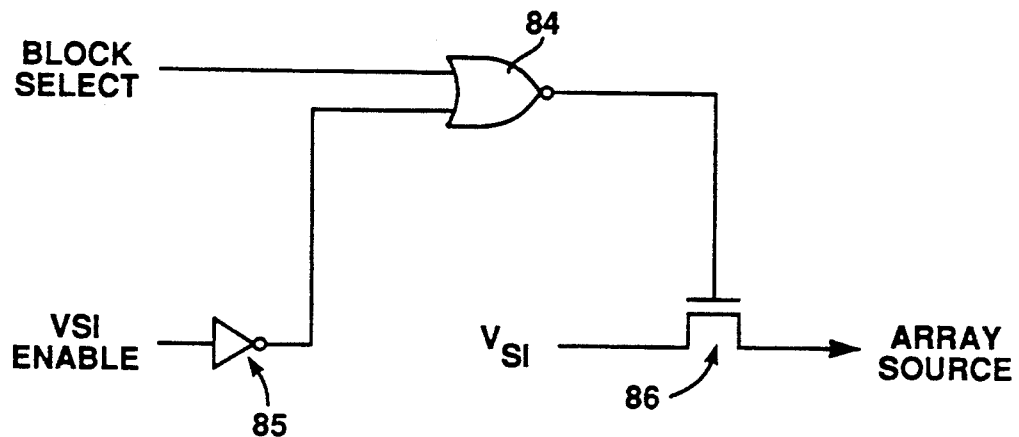
FIG. 6 is an logic diagram showing the switching logic of the present invention.

Referring now to FIG. 6, Y decoder 60 logic is shown which determines whether or not the $V_{SI}$ voltage will be applied to a given block of cells in the flash memory array. Therefore, in the preferred embodiment of the present invention, the logic shown in FIG. 6 is duplicated for each separate logical block in the array.

Reviewing the sequence of events which occurs in determining usage of the $V_{SI}$ signal, when a block is not selected for programming (an "unselected block" as described with reference to FIG. 2B), the block select signal will be a logical zero. Further, when the $V_{SI}$ signal is enabled (which is anytime no blocks are being programmed; Note: in order to save power, the $V_{SI}$ generator circuitry is also turned off by the $V_{SI}$ enable signal when no programming is occurring), the $V_{SI}$ enable signal will be a logical one which will be inverted by inverter 85. Therefore, when the Block Select is not selected and the $V_{SI}$ signal is enabled, the output of the NOR gate 84 will be a logical one which will turn on transistor 86.

Turning on transistor 86 will couple the $V_{SI}$ voltage signal to the sources of all the transistors in that block. In this way, the sources of all the transistors in blocks not being programmed have the $V_{SI}$ potential of approximately +2 volts coupled to them which thus avoids both the slow erase and the slow programming conditions.

Furthermore, because the different blocks supported by the $V_{SI}$ voltage signal contain different numbers of cells, the capacitive effect of these different blocks will be different. In other words, a block containing more cells will take longer for the $V_{SI}$ voltage to rise to the +2 volt level than will a block containing fewer cells.

To overcome this disparity in $V_{SI}$ voltage rise time, in the preferred embodiment of the present invention, transistor 86 is sized so as to compensate for the different block sizes. Because the main array block is much larger than either of the boot or parameter blocks, transistor 86 of the switching logic for the main array is much larger than for either the boot or parameter blocks. Similarly, because the boot block is larger than either of the parameter blocks, transistor 86 of the switching logic for the boot block is larger than for either of the parameter blocks.

In the preferred embodiment of the present invention, while the length of transistor 86 is approximately constant at 2 μm while the width varies from 25 μm (for each of the two 32 bit line parameter blocks) to 50 μm (for the 64 bit line boot block) to 600 μm (for the 896 bit line main block).

What is claimed is:

1. An electrically erasable and electrically programmable read-only memory fabricated on a silicon substrate and employing a plurality of memory cells arranged in blocks each memory cell having a floating gate, an improvement for maintaining the state of said cells in blocks not presently being programmed comprising:
   first and second bias potentials, said first bias potential being lower than a programming potential and said second bias potential being lower than said first potential;
   first, second and third transistors coupled in series between said programming potential and ground, said first and third transistors being matched one to another, the gate of said first transistor being coupled to said first bias potential, the gate of the third transistor being coupled to said second bias potential and the gate of said second transistor being coupled to a first node disposed between said first and second transistors, said first and third transistors providing a first potential at said first node disposed between said first and said second transistor;
   fourth and fifth matched transistors coupled in series between a reading potential and ground, the gate of said fourth transistor coupled to said first node and the gate of said fifth transistor coupled to the gate of said third transistor such that the gate of said fourth transistor is approximately at said first potential and the gate of said fifth transistor is at said second bias potential, said fourth and fifth transistors providing a second potential at a second node disposed between said fourth and fifth transistors,
   switch means for switching the source of said cells in blocks not presently being programmed to said second potential if cells in other blocks are presently being programmed.

2. The improvement defined by claim 1 wherein said silicon substrate is of a first conductivity type and said first and third transistors are formed in wells of a second conductivity type.

3. The improvement defined by claim 2 wherein said first and second bias potentials comprise resistive means formed in said silicon substrate in a region of said second conductivity type and coupled between said programming potential and ground.

4. The improvement defined by claim 3 wherein said first, third and fifth transistors are comprised of p-type field-effect transistors.

5. The improvement defined by claim 4 wherein said second and fourth transistors are comprised of n-type field-effect transistors.

6. The improvement defined by claim 2 wherein the second bias potential is ground.

7. The improvement of claim 5 wherein said improvement may be switched off if no blocks are being programmed.

8. An electrically erasable and electrically programmable read-only memory fabricated on a silicon substrate and having a plurality of memory cells arranged in blocks each memory cell having a floating gate, an improvement for maintaining the state of said cells in blocks not presently being programmed comprising:
   (i) first circuit means incorporated on said substrate for providing a first potential lower than the potential used to program said cells, said first circuit means comprising:
      (a) a first field-effect transistor being coupled in series with a second field-effect transistor being coupled in series with a third field-effect transistor, said first field-effect transistor also coupled to a programming potential and matched to said third field-effect transistor, said third field-effect transistor also coupled to a ground potential;
      (b) a resistor means coupled to said programming potential for developing said first potential and a bias potential, the gates of said first and said third transistors being coupled to said resistor means such that the gate of said first transistor is approximately at said first potential and the gate of said third transistor is at said bias potential, a first node disposed between said first transistor and said second transistor providing said first potential, the gate of said second transistor coupled to said first node such that the gate of said second transistor is also approximately at said first potential,
   (ii) second circuit means incorporated on said substrate for providing a second potential lower than said first potential, said second circuit comprising:
      (a) fourth and fifth field-effect transistors coupled in series and matched to one another, said fourth transistor also coupled to a reading potential, said fifth field-effect transistor also coupled to a ground potential, the gate of said fourth transistor being coupled to said first node and the gate of said fifth transistor being coupled to the gate of the third transistor such that the gate of said fourth transistor is approximately at said first potential and the gate of said fifth transistor is at said bias potential;

(b) said second potential being provided at a second node disposed between said fourth and fifth transistors, (iii) switch means incorporated on said substrate for switching the source of said cells in blocks not presently being programmed to said second potential if cells in other blocks are presently being programmed.

9. The improvement defined by claim 8 wherein said silicon substrate is of a first conductivity type and said first and third transistors are formed in wells of a second conductivity type.

10. The improvement defined by claim 9 wherein said resistor means comprises a resistor formed in said silicon substrate in a region of said second conductivity type.

11. The improvement defined by claim 10 wherein said first, third and fifth transistors are comprised of p-type field-effect transistors.

12. The improvement defined by claim 11 wherein said second and fourth transistors are comprised of n-type field-effect transistors.

13. The improvement of claim 12 wherein said improvement may be switched off if no blocks are being programmed.

14. A voltage generation means comprising:
i) A first resistor having one terminal coupled to a first potential and a second terminal coupled to a first node;
ii) a second resistor having one terminal coupled to said first node and a second terminal coupled to a second potential;
iii) a first p-type transistor having a drain, a source and a gate, said source of said first p-type transistor coupled to said first potential, said gate of said first p-type transistor coupled to said first node and said drain of said first p-type transistor coupled to a second node;
iv) a first n-type transistor having a drain, a source and a gate, said drain of said first n-type transistor coupled to said second node, said gate of said first n-type transistor coupled to said second node and said source of said first n-type transistor coupled to a third node;
v) a second p-type transistor matched to said first p-type transistor, said second p-type transistor having a drain, a source and a gate, said source of said second p-type transistor coupled to said third node, said gate of said second p-type transistor coupled to said second potential and said drain of said second p-type transistor coupled to said second potential;
vi) a second n-type transistor having a drain, a source and a gate, said drain of said second n-type transistor coupled to a third potential, said gate of said second n-type transistor coupled to said second node and said source of said second n-type transistor coupled to a fourth node;
vii) a third p-type transistor matched to said second p-type transistor, said third p-type transistor having a drain, a source and a gate, said source of said third p-type transistor coupled to said fourth node, said gate of said third n-type transistor coupled to said second potential and said drain of said third p-type transistor coupled to said second potential;
wherein said fourth node is an output node of the voltage generation means.

15. The voltage generation means of claim 14 wherein said first potential is approximately +12 volts.

16. The voltage generation means of claim 15 wherein said second potential is ground potential.

17. The voltage generation means of claim 16 wherein said third potential is approximately +5 volts.

18. The voltage generation means of claim 17 wherein said voltage generation output fourth node is at a potential of approximately +2 volts.

19. The voltage generation means of claim 18 further comprising a means for switching said output node of said voltage generation means.

20. The voltage generation means of claim 19 wherein said switching means comprises a Not OR (NOR) gate having as a first input a block select signal and a second input an inverted voltage generation enable signal.

21. The voltage generation means of claim 19 wherein said switching means comprises one transistor associated with each said block, each said transistor being of an adequate size to allow the source inhibit potential rise time for the associated block to approximately match the source inhibit potential rise time of all other blocks.

22. The improvement of claim 18 wherein said improvement may be switched off if no blocks are being programmed.

* * * * *